United States Patent
Stone

(10) Patent No.: US 8,969,127 B2
(45) Date of Patent: Mar. 3, 2015

(54) APPARATUS FOR AND METHOD OF FABRICATING AN ELECTRONIC DEVICE BY TRANSFER OF MATERIAL ONTO A SUBSTRATE

(75) Inventor: Kate Stone, Cambridgeshire (GB)

(73) Assignee: Novalia Ltd, Cambridgeshire (GB)

( * ) Notice: Subject to any disclaimer, the term of this patent is extended or adjusted under 35 U.S.C. 154(b) by 565 days.

(21) Appl. No.: 12/738,173

(22) PCT Filed: Oct. 17, 2008

(86) PCT No.: PCT/GB2008/050950
§ 371 (c)(1),
(2), (4) Date: Jul. 12, 2010

(87) PCT Pub. No.: WO2009/050516
PCT Pub. Date: Apr. 23, 2009

(65) Prior Publication Data
US 2010/0295028 A1    Nov. 25, 2010

(30) Foreign Application Priority Data
Oct. 18, 2007    (GB) .................................. 0720392.0

(51) Int. Cl.
H01L 51/40    (2006.01)
H01L 51/00    (2006.01)
H01L 51/05    (2006.01)

(52) U.S. Cl.
CPC ......... H01L 51/0004 (2013.01); H01L 51/0512 (2013.01)
USPC ............................... 438/99; 257/40; 156/234

(58) Field of Classification Search
CPC ................................. H01L 51/40; H01L 51/00
USPC .................................. 257/40; 156/234; 438/99
See application file for complete search history.

(56) References Cited

U.S. PATENT DOCUMENTS

| | | | | | |
|---|---|---|---|---|---|
| 4,400,409 | A | * | 8/1983 | Izu et al. | 438/62 |
| 4,677,738 | A | * | 7/1987 | Izu et al. | 438/62 |
| 5,512,131 | A | * | 4/1996 | Kumar et al. | 438/738 |
| 5,707,745 | A | * | 1/1998 | Forrest et al. | 428/432 |
| 5,776,748 | A | * | 7/1998 | Singhvi et al. | 435/180 |
| 5,817,242 | A | * | 10/1998 | Biebuyck et al. | 216/41 |
| 5,937,758 | A | * | 8/1999 | Maracas et al. | 101/327 |
| 5,976,257 | A | * | 11/1999 | Kanai et al. | 118/718 |

(Continued)

FOREIGN PATENT DOCUMENTS

| | | |
|---|---|---|
| DE | 10 2004 005370 A1 | 9/2005 |
| EP | 1424740 A2 | 6/2004 |

(Continued)

OTHER PUBLICATIONS

International Preliminary Report on Patentability issued in International Application No. PCT/GB2008/050949 dated Apr. 20, 2010.

(Continued)

*Primary Examiner* — Caleb Henry
(74) *Attorney, Agent, or Firm* — McCarter & English, LLP; David R. Burns

(57) ABSTRACT

A method of fabricating an electronic device comprises providing a layer structure (48) supported on a first substrate (34), providing a second, patterned substrate (28) and transferring selected areas (58) of the first layer structure onto the second substrate.

21 Claims, 4 Drawing Sheets

(56) References Cited

U.S. PATENT DOCUMENTS

| | | | |
|---|---|---|---|
| 5,976,826 A * | 11/1999 | Singhvi et al. | 435/29 |
| 6,027,595 A * | 2/2000 | Suleski | 156/230 |
| 6,096,389 A * | 8/2000 | Kanai | 427/575 |
| 6,143,991 A | 11/2000 | Moriyama | |
| 6,180,239 B1 * | 1/2001 | Whitesides et al. | 428/411.1 |
| 6,309,580 B1 * | 10/2001 | Chou | 264/338 |
| 6,368,838 B1 * | 4/2002 | Singhvi et al. | 435/177 |
| 6,380,101 B1 * | 4/2002 | Breen et al. | 438/765 |
| 6,518,168 B1 * | 2/2003 | Clem et al. | 438/623 |
| 6,645,573 B2 * | 11/2003 | Higashikawa et al. | 427/569 |
| 6,673,287 B2 * | 1/2004 | Breen et al. | 264/83 |
| 6,726,812 B1 * | 4/2004 | Toyama | 204/192.11 |
| 6,780,492 B2 * | 8/2004 | Hawker et al. | 428/198 |
| 6,792,856 B2 * | 9/2004 | Hall et al. | 101/368 |
| 6,811,816 B2 * | 11/2004 | Tamura et al. | 427/248.1 |
| 6,858,087 B2 * | 2/2005 | Hori et al. | 118/724 |
| 6,860,956 B2 * | 3/2005 | Bao et al. | 156/232 |
| 6,887,332 B1 * | 5/2005 | Kagan et al. | 427/97.3 |
| 6,946,597 B2 * | 9/2005 | Sager et al. | 136/263 |
| 7,061,010 B2 * | 6/2006 | Minakata | 257/40 |
| 7,067,306 B2 * | 6/2006 | Singhvi et al. | 435/283.1 |
| 7,071,081 B2 * | 7/2006 | Higashikawa | 438/478 |
| 7,117,790 B2 * | 10/2006 | Kendale et al. | 101/327 |
| 7,195,733 B2 * | 3/2007 | Rogers et al. | 264/496 |
| 7,202,007 B2 * | 4/2007 | Shibata et al. | 430/199 |
| 7,296,519 B2 * | 11/2007 | Dona et al. | 101/486 |
| 7,361,927 B2 * | 4/2008 | Kawase et al. | 257/40 |
| 7,363,854 B2 * | 4/2008 | Sewell | 101/41 |
| 7,462,244 B2 * | 12/2008 | Utsugi et al. | 118/718 |
| 7,514,342 B2 * | 4/2009 | Yasuno | 438/493 |
| 7,557,367 B2 * | 7/2009 | Rogers et al. | 257/9 |
| 7,588,657 B2 * | 9/2009 | Russel et al. | 156/242 |
| 7,622,367 B1 * | 11/2009 | Nuzzo et al. | 438/472 |
| 7,682,981 B2 * | 3/2010 | Shepard | 438/713 |
| 7,713,799 B2 * | 5/2010 | Oh | 438/149 |
| 7,777,128 B2 * | 8/2010 | Montello et al. | 136/256 |
| 7,802,517 B2 * | 9/2010 | Wessels et al. | 101/483 |
| 7,803,308 B2 * | 9/2010 | GanapathiSubramanian et al. | 264/334 |
| 7,825,406 B2 * | 11/2010 | Yoshida et al. | 257/40 |
| 7,852,435 B2 * | 12/2010 | Fujisawa et al. | 349/95 |
| 7,963,757 B2 * | 6/2011 | Lee et al. | 425/92 |
| 7,968,804 B2 * | 6/2011 | Frey et al. | 174/392 |
| 8,557,351 B2 * | 10/2013 | Xu | 427/553 |
| 2002/0197554 A1 * | 12/2002 | Wolk et al. | 430/200 |
| 2003/0057601 A1 * | 3/2003 | Reitz et al. | 264/239 |
| 2003/0173890 A1 * | 9/2003 | Yamazaki et al. | 313/498 |
| 2004/0096698 A1 | 5/2004 | Kishimoto | |
| 2004/0108047 A1 | 6/2004 | Afzali-Ardakani et al. | |
| 2004/0121568 A1 * | 6/2004 | Kim et al. | 438/584 |
| 2004/0187917 A1 * | 9/2004 | Pichler | 136/263 |
| 2004/0231781 A1 * | 11/2004 | Bao et al. | 156/230 |
| 2004/0232943 A1 | 11/2004 | Sheats et al. | |
| 2005/0009327 A1 * | 1/2005 | Yoshida et al. | 438/661 |
| 2005/0035374 A1 | 2/2005 | Malajovich | |
| 2005/0150865 A1 | 7/2005 | Fujinawa et al. | |
| 2005/0170621 A1 * | 8/2005 | Kim et al. | 438/584 |
| 2005/0173701 A1 * | 8/2005 | Kawase et al. | 257/40 |
| 2005/0233491 A1 * | 10/2005 | Hirai | 438/48 |
| 2005/0244990 A1 * | 11/2005 | Kim | 438/21 |
| 2005/0268962 A1 * | 12/2005 | Gaudiana et al. | 136/255 |
| 2005/0274541 A1 | 12/2005 | Takahashi | |
| 2006/0110545 A1 * | 5/2006 | Toyoda | 427/554 |
| 2006/0134841 A1 * | 6/2006 | Oh | 438/151 |
| 2006/0196377 A1 * | 9/2006 | Loopstra et al. | 101/483 |
| 2006/0254440 A1 * | 11/2006 | Choi et al. | 101/180 |
| 2006/0284169 A1 | 12/2006 | Park et al. | |
| 2007/0009827 A1 * | 1/2007 | Sheats et al. | 430/200 |
| 2007/0020821 A1 * | 1/2007 | Toyoda | 438/149 |
| 2007/0056680 A1 * | 3/2007 | Tan et al. | 156/232 |
| 2007/0077679 A1 | 4/2007 | Wild et al. | |
| 2007/0104879 A1 * | 5/2007 | Kodas et al. | 427/375 |
| 2007/0145632 A1 * | 6/2007 | Peeters et al. | 264/219 |
| 2007/0181059 A1 * | 8/2007 | Lee et al. | 118/211 |
| 2007/0184198 A1 * | 8/2007 | Li et al. | 427/372.2 |
| 2007/0200489 A1 * | 8/2007 | Poon et al. | 313/502 |
| 2007/0215869 A1 * | 9/2007 | Moriya et al. | 257/40 |
| 2008/0012006 A1 * | 1/2008 | Bailey et al. | 257/40 |
| 2008/0047930 A1 * | 2/2008 | Blanchet et al. | 216/41 |
| 2008/0055581 A1 * | 3/2008 | Rogers et al. | 355/95 |
| 2008/0076205 A1 * | 3/2008 | Miyai et al. | 438/99 |
| 2008/0083484 A1 * | 4/2008 | Blanchet et al. | 156/234 |
| 2008/0227232 A1 * | 9/2008 | Yamazaki et al. | 438/34 |
| 2008/0245248 A1 * | 10/2008 | Takamatsu | 101/217 |
| 2008/0289524 A1 * | 11/2008 | Jongerius | 101/376 |
| 2009/0199960 A1 * | 8/2009 | Nuzzo et al. | 156/230 |
| 2010/0261321 A1 * | 10/2010 | Hirano et al. | 438/158 |

FOREIGN PATENT DOCUMENTS

| | | |
|---|---|---|
| JP | 07 283493 A | 10/1995 |
| WO | WO03079734 A1 | 9/2003 |
| WO | WO2004087434 A1 | 10/2004 |
| WO | WO2005030491 A1 | 4/2005 |
| WO | WO2009050516 A1 | 4/2009 |

OTHER PUBLICATIONS

International Search Report for Application No. PCT/GB2008/050950, dated Jan. 29, 2009.

Written Opinion for Application No. PCT/GB2008/050950, dated Jan. 29, 2009.

Search Report for Application No. GB0720392, dated Mar. 3, 2008.

* cited by examiner

APPARATUS FOR AND METHOD OF FABRICATING AN ELECTRONIC DEVICE BY TRANSFER OF MATERIAL ONTO A SUBSTRATE

RELATED APPLICATIONS

This application is a 35 U.S.C. §371 national stage filing of International Application No. PCT/GB2008/050950, filed Oct. 17, 2008, which is related and claims priority to GB 0720392.0, filed Oct. 18, 2007. The entire contents of these applications are explicitly incorporated herein by reference.

FIELD OF THE INVENTION

The present invention relates to a method of fabricating an electronic device, particularly, but not exclusively, an organic thin film transistor.

BACKGROUND

Organic thin film transistors can be fabricated using well-known thin film deposition and patterning processes, such as evaporation, sputtering, spin coating, optical lithography and etching. Usually during fabrication, thin films of material are deposited and patterned in separate steps. This allows a manufacturer to control film quality and feature size independently and so maximise film quality and minimise feature sizes. However, many of these thin film processes are not particularly suited to fabricating transistors at low cost and in high volumes.

To address this problem, organic thin film transistors can also be fabricated using printing processes, such as ink jet printing. However, this usually results in a drop in film quality and/or rise in minimum feature size.

The present invention seeks to provide an improved method of fabricating an electronic device.

SUMMARY

According to a first aspect of the present invention there is provided a method of fabricating an electronic device comprising providing a layer structure supported on a first substrate, providing a second, patterned substrate and transferring selected areas of the first layer structure onto the second substrate.

This can be used to enjoy the benefits of being able to prepare high quality films and of being able to fabricate devices using a high-throughput process.

The layer structure may include at least one conductive layer, at least one insulating layer and/or at least one semiconducting layer. The layers may be co-extensive. The first substrate may be a sheet.

The second, patterned substrate may comprise electrically conductive regions supported on a sheet.

The electronic device may be an organic thin film transistor. The patterned substrate may include source and drain electrodes and the layer structure may comprise a gate metallisation layer, a gate insulating layer and a semiconducting layer.

Transferring the selected areas of the first layer structure onto the second substrate may comprise transferring all of the first layer structure across the extent of the electronic device or even all of the first layer structure.

Transferring the selected areas of the first layer structure onto the second substrate may comprise stamping the layer structure from the first layer structure.

Stamping may comprise heating a stamp to at least 300° C.

The method may comprise forming the layer structure on the first substrate by depositing a first layer on the substrate. Depositing the first layer may comprise evaporating or printing the first layer onto the substrate. The method may further comprise depositing a second layer over the first layer. Depositing the second layer may comprise printing the second layer onto the first layer. The method may further comprise depositing a third layer over the second layer. Depositing the third layer may comprise printing the third layer onto the second layer.

The method may comprises forming the patterned substrate by etching regions of a layer structure to form a patterned layer structure on a substrate or by depositing a patterned layer structure onto a substrate. The layer structure may comprise a single layer.

According to a second aspect of the present invention there is provided a device fabricated by the method.

According to a third aspect of the present invention there is provided apparatus for fabricating an electronic device comprising means for providing a layer structure supported on a first substrate, means for providing a second, patterned substrate; and means for transferring selected areas of the first layer structure onto the second substrate.

The means for providing the layer structure may comprise means for depositing a metallic layer on the substrate. The means for providing the layer structure may comprise printing apparatus, such as gravure printing apparatus.

The means for providing a second, patterned substrate may comprise printing apparatus.

The means for transferring selected areas from the first layer structure onto the second substrate may comprise a stamp. The stamp may be provided on a cylinder.

BRIEF DESCRIPTION OF THE DRAWINGS

Embodiments of the present invention will now be described, by way of example, with reference to the accompanying drawings in which.

DETAILED DESCRIPTION

Figure 1:
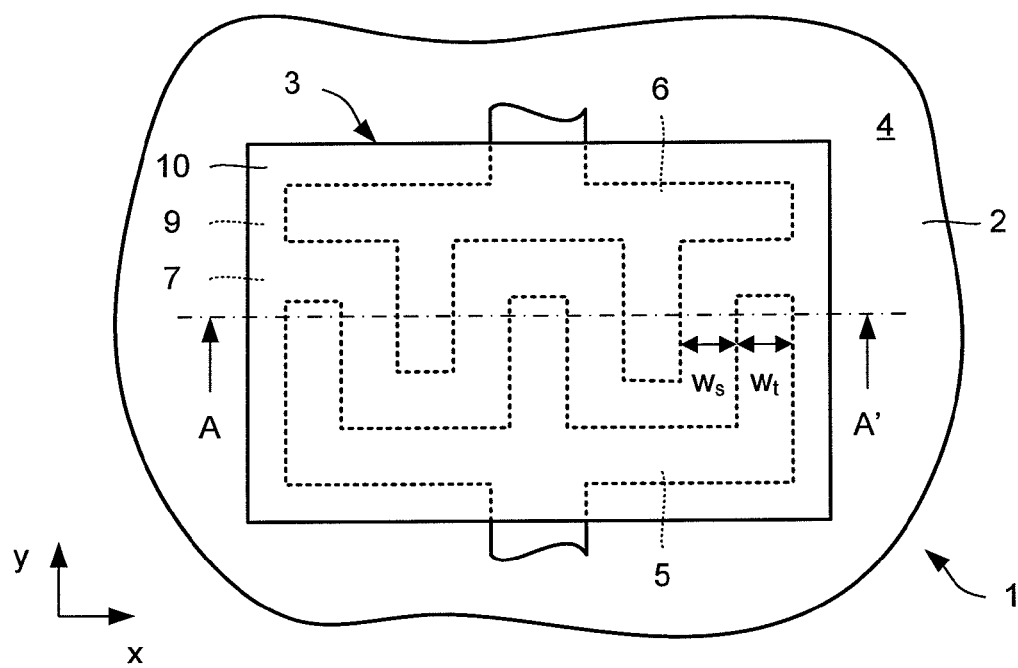
FIG. 1 is a plan view of an organic thin film transistor.
Figure 2:
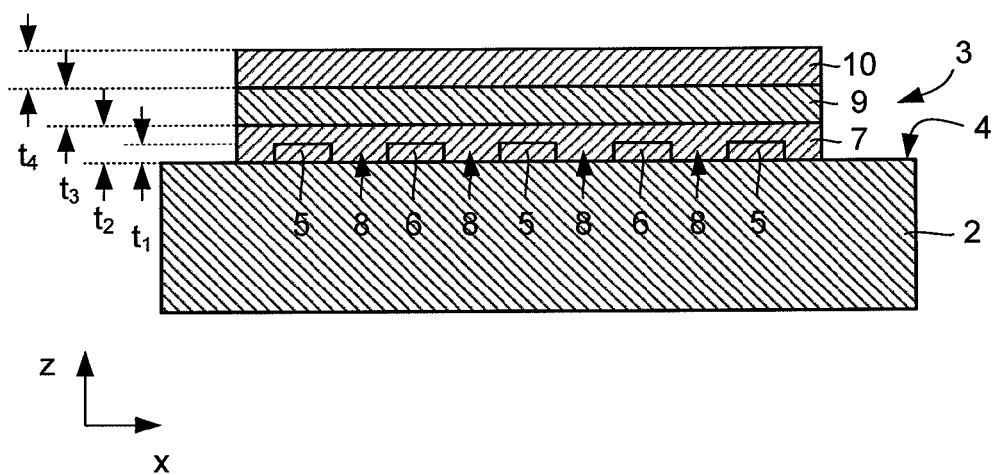
FIG. 2 is a cross-sectional view of the transistor shown in FIG. 1.

Referring to FIGS. 1 and 2, a thin film transistor 1 in accordance with the present invention is shown. The thin film transistor 1 comprises a flexible substrate 2 formed from a plastic material, such as polyethylene terephthalate (PET). The substrate 2 supports a "top gate, bottom electrode" transistor structure 3 on a first surface 4 (hereinafter referred to as "the upper face").

The substrate 2 supports source and drain electrodes 5, 6 formed from a metal, such as aluminium, or alloy on its upper surface 4. A patterned layer 7 of an organic semiconductor, such as poly(3-hexylthiophene) ("P3HT"), lies over the substrate 2 and the source and drain electrodes 5, 6 so as to form a channel 8 between the source and drain electrodes 5, 6. A patterned layer 9 of insulating material, such as poly(4-vinyl phenol) ("PVP"), lies over the organic semiconductor layer 7 to form a gate dielectric and a gate electrode 10 formed from a metal, such as aluminium, or metal alloy lies over the gate dielectric 9.

Referring in particular to FIG. 1, the source and drain electrodes 5, 6 have a track width, $w_t$, of about 30 μm and a separation, $w_s$, of about 30 μm. The track width and track separation may have a value between 5 and 50 μm, i.e. 5 μm≤$w_t$≤50 μm and 5 μm≤$w_s$≤50 μm. As shown in FIG. 1, the source and drain electrodes 5, 6 have an interdigitated finger arrangement. However, other electrode arrangements may be used. As shown in FIG. 1, the organic semiconductor layer 7, dielectric layer 9 and gate electrode 10 are co-extensive.

Referring in particular to FIG. 2, the source and drain electrodes 5, 6 have a thickness, $t_1$, of about 40 nm. The organic semiconductor layer 7 has a thickness, $t_2$, of about 100 nm. The gate dielectric 8 has a thickness, $t_3$, of about 1 μm and the gate electrode 10 has a thickness of about 40 nm.

Figure 3:
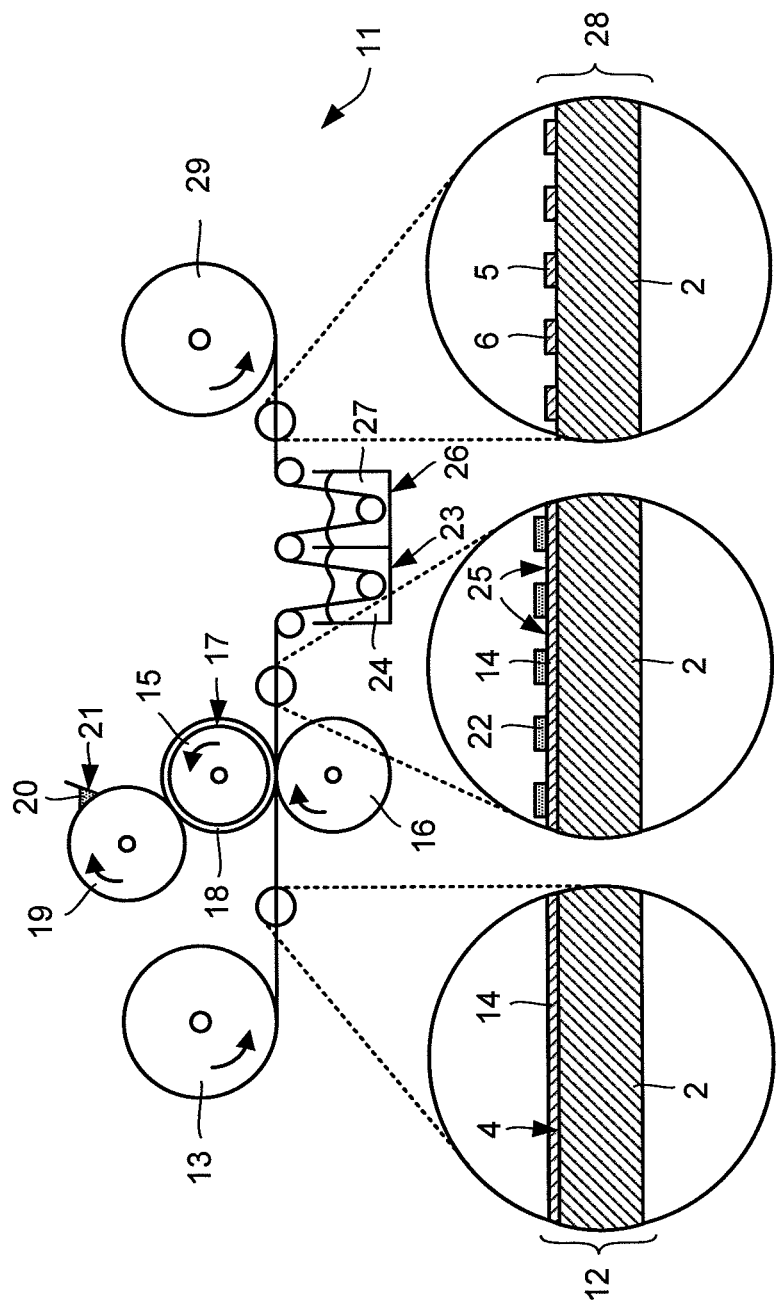
FIG. 3 is a schematic diagram showing a process of fabricating a patterned substrate.
Figure 4:
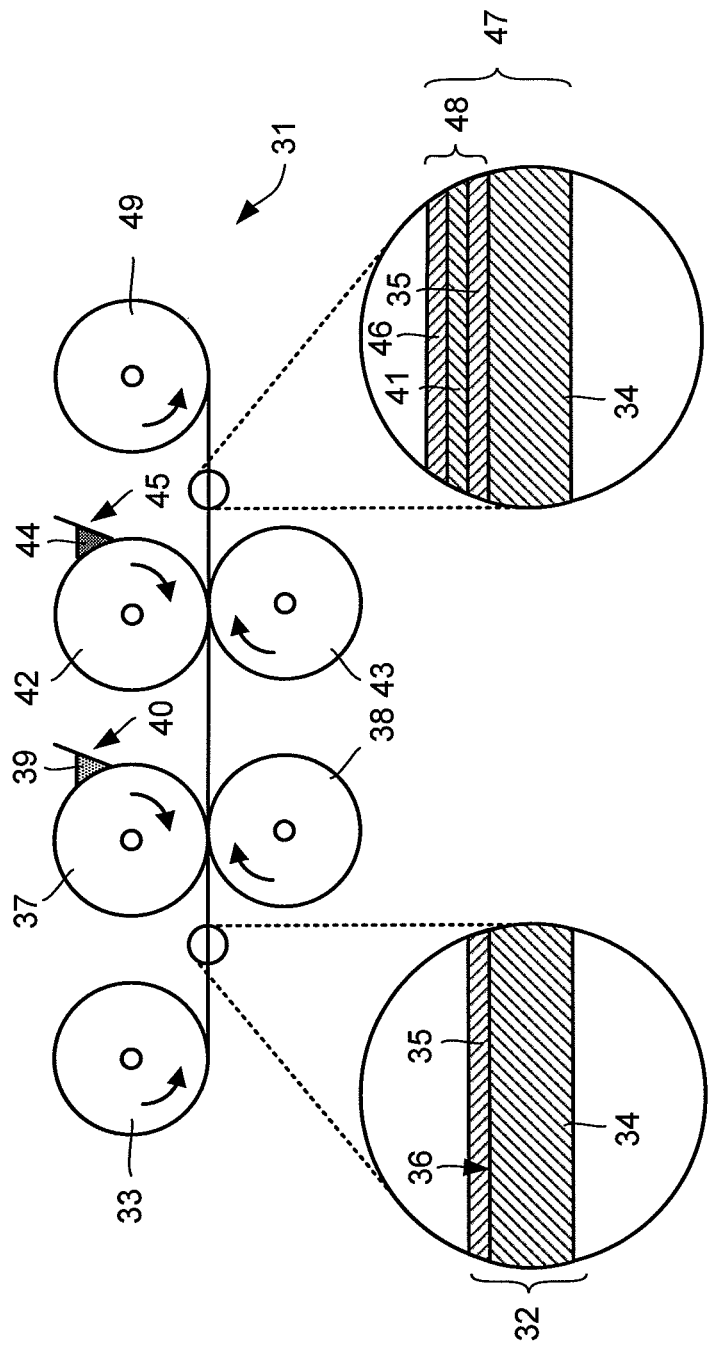
FIG. 4 is a schematic diagram showing a process of fabricating a laminate.
Figure 5:
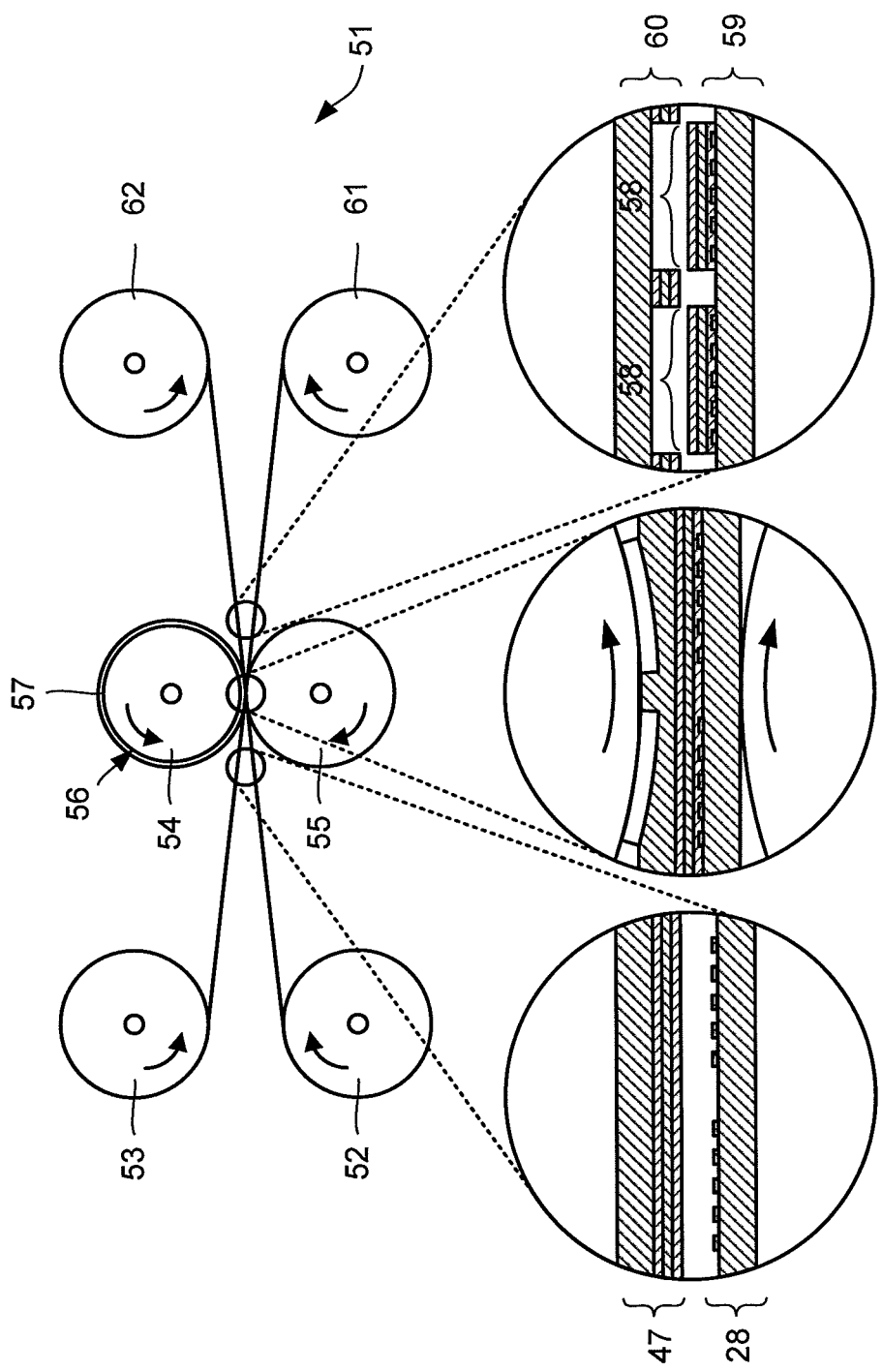
FIG. 5 is a schematic diagram showing a process of fabricating the organic transistor shown in FIG. 1 in accordance with the present invention.

Referring to FIGS. 3 to 5, apparatus for and a method of fabricating the thin film transistor 1 shown in FIGS. 1 and 2 in accordance with the present invention will now be described.

Referring in particular to FIG. 3, a flexographic printing apparatus 11 is shown.

A sheet 12 (or "web") of metallised film is wrapped around an unwind roller 13. The sheet 12 comprises a substrate 2, which will eventually form the substrate for the transistor 1 (FIG. 1), and a thin layer 14 of metallisation, in this case aluminium, supported on one side 4. The metallisation 14 can be applied to the substrate 2 using a moving vacuum metallisation process (not shown), at speeds of up to 60 km/hr.

The sheet 12 is paid out from the unwind roller 13 and passed between a printing roller 15 and an impression roller 16 providing support. An outer surface 17 of the printing roller 15 carries a printing plate or screen 18 defining an image of the source and drain electrodes 5, 6 (FIG. 1). The surface of the metallised sheet may be treated, e.g. using corona discharge, to improve adhesion. The printing roller 15 co-operates with an anilox roller 19 which is used to apply a measured amount of ink 20 from a source 21 so as to produce an ink pattern 22 which provides an etch mask on the metallisation layer 14. The ink 20 may comprise Microposit S1813 photoresist (Rohm & Haas) or other suitable mixtures of polymers dissolved in, for example non-aqueous, solvent and which is suitable for printing. The resist may be heated, e.g. to reduce pin holes. The masked metallised sheet 13' passes through a first bath 23 containing a wet etch 24 which etches unmasked areas 25 of metallisation 14 and then through a second bath 26 containing a rinse 27 to remove the etch mask 22. The wet etch 24 for aluminium may be an aqueous solution of phosphoric acid, acetic acid and nitric acid (Microchem Systems Ltd) or aqueous sodium hydroxide. The rinse 27 may be Microposit 1165 photoresist remover (Rohm & Haas). This leaves a patterned sheet 28 comprising the substrate 2 and patterned regions of metallisation, namely the source and drain electrodes 5, 6. The patterned sheet 28 is wound onto a re-wind roller 29.

The process can be run at high speeds, e.g. 60 m/min, and has an advantage that the printing process is not used to apply a conductive ink and so can be optimised for print resolution without needing to take into account loading the ink with conductive particles. The etching process is quick, typically taking about 1 s to etch through the metallisation layer 14.

The printing plate 18 is formed by laser ablation and can form images with a resolution of about 10 μm and can even reach resolutions of about 5 μm.

Other forms of coating or printing can be used, such as gravure.

Referring now to FIG. 4, a reverse gravure printing apparatus 31 is shown.

A sheet 32 of metallised film is wrapped around an unwind roller 33. The sheet 32 comprises the substrate 34 supporting a thin layer 35 of metallisation, in this case aluminium, on one side 36.

The sheet 32 is paid out from the roller 33 and is passed between a first gravure cylinder 37 and a corresponding counter impression roller 38, which is used to apply a dielectric solution 39 from source 40 over the metallisation 35. The solution 39 dries or is cured, for example using ultraviolet light, to leave a dielectric layer 41 on the sheet 33. The sheet 32 is then passed between a second gravure cylinder 42 and a corresponding counter impression roller 43, which is used to apply an organic semiconductor solution 44 from source 45 over the dielectric layer 41. The organic semiconductor solution 42 dries or is cured to form an organic semiconductor layer 46.

The dielectric solution 39 may comprise poly(4-vinyl phenol) (Sigma-Aldrich) dissolved in a suitable solvent, such as isopropyl alcohol ("IPA"). The organic semiconductor solution 44 may comprise poly(3-hexylthiophene) (Sigma-Aldrich) dissolved in a suitable solvent, such as chloroform or xylene. Each solution 39, 41 may include two or more different solvents and/or may include additive(s) to provide a solution which suitable for printing, e.g. having appropriate viscosity.

The printing process produces a laminated sheet 47 including a multiple layer structure 48 comprising the metallisation layer 35, the dielectric layer 41 and the organic semiconductor layer 46. The laminate sheet 47 is wound onto a re-wind roller 49.

This process can be used to form layers 35, 41, 46 which are thin (e.g. less than 500 nm thick) and high quality, namely substantially free of pin holes and contamination.

Other forms of coating or printing can be used, such as gravure and spray coating.

The patterned sheet 28 (FIG. 3) and laminate sheet 47 (FIG. 4) are used to fabricate the transistor 1 (FIG. 1) in a fast roll-to-roll process using a stamping process.

Referring to FIG. 5, a layer transferring apparatus 51 is shown. In this example, stamping apparatus is used.

The patterned sheet 28 and the laminate sheet 47 are wrapped around first and second rollers respectively 52, 53.

The sheets 28, 47 are paid out with the layer structure 48 and the electrodes 5, 6 facing each other and are passed through a stamp comprising a patterning roller 54 and an impression roller 55. An outer surface 56 of the patterning roller 54 carries a plate 57 defining an image of the gate electrode 10 (FIG. 1). The patterning roller 54 stamps selected regions 58 of the layer structure 48 from the first sheet 47 over the electrodes 5, 6 onto the second sheet 48. Cold stamping or hot stamping may be used. For hot stamping, the patterning roller 54 is heated to more than about 300° C.

The transfer process need not use stamping, e.g. to apply high pressure to transfer layer structures. For example, selected regions 58 may be transferred by applying merely kissing pressure. Selected regions 58 may be transferred by pulling the regions from the layer structure 48, for example by virtue of surface tension.

A sheet 59 carrying the transistor 1 having and another spent laminate sheet 60 are wound onto respective rollers 61, 62.

The stamping process is continuous and can be used to form large numbers of transistors 1 or other types of devices, such as interconnects and sensors, simultaneously.

The sheet 59 is processed further to interconnect transistors and/or other devices and a further stamping process can be used to deposit a layer structure comprising a single layer of conducting material so as to provide interconnects.

It will be appreciated that many modifications may be made to the embodiments hereinbefore described.

For example, the layer structure in the laminate may have only one layer or may have more than one layer.

The device may be other forms of electronic device such as a battery, sensor or organic light emitting diode. The device may be based on electron and/or hole transport.

The semiconductor may be an organic semiconductor such as be poly3-benzothiazolyl thiophene ("PBTT") or dioctylfluorene-bithiophene ("F8T2")

The method may be used to fabricate devices having a bottom gate structure.

The process may be sheet fed and so stages, such as stamping, may be board-based rather than cylinder-based.

The invention claimed is:

1. A method of fabricating an electronic device comprising:
   providing a laminate sheet comprising a layer structure supported on a first substrate;
   providing a patterned sheet comprising a patterned layer structure on a second substrate;
   passing the laminate and patterned sheets through a pressure-applying means, wherein the layer structure faces the patterned layer structure and wherein the pressure-applying means includes a plate defining an image; and
   transferring selected areas of the layer structure corresponding to the image from the laminate sheet onto the patterned sheet using the pressure-applying means, leaving unselected areas of the layer structure on the first substrate.

2. A method according to claim 1, wherein the layer structure includes at least one conductive layer.

3. A method according to claim 1, wherein the layer structure includes at least one insulating layer.

4. A method according to claim 1, wherein the layer structures includes at least one semiconducting layer.

5. A method according to claim 1, wherein the electronic device is an organic thin film transistor.

6. A method according to claim 1, wherein the patterned sheet carries source and drain electrodes and the layer structure comprises a gate metallisation layer, a gate insulating layer and a semiconducting layer.

7. A method according to claim 1, wherein transferring the selected areas of the layer structure onto the second sheet comprises stamping the layer structure from the laminate sheet onto the patterned sheet.

8. A method according to claim 7, wherein stamping comprises heating a stamp to at least 300° C.

9. A method according to claim 1, comprising:
   forming the layer structure on the first substrate by depositing a first layer on the first substrate.

10. A method according to claim 9, wherein depositing the first layer comprises evaporating the first layer onto the first substrate.

11. A method according to claim 9, wherein depositing the first layer comprises printing the first layer onto the first substrate.

12. A method according to claim 9, further comprising depositing a second layer over the first layer.

13. A method according to claim 12, wherein depositing the second layer comprises printing the second layer onto the first layer.

14. A method according to claim 12, further comprising depositing a third layer over the second layer.

15. A method according to claim 14, wherein depositing the third layer comprises printing the third layer onto the second layer.

16. A method according to claim 1, comprising:
   forming the patterned sheet by etching regions of a layer structure to form the patterned layer structure on the second substrate.

17. A method according to claim 1, comprising:
   forming the patterned sheet by depositing a patterned layer structure onto the second substrate.

18. A method according to claim 16, wherein the layer structure comprises a single layer.

19. A device fabricated by a method according to claim 1.

20. A method of fabricating an electronic device comprising:
   providing a laminate sheet comprising a layer structure supported on a first substrate, the layer structure including at least one dielectric layer and least one conductive layer disposed between the at least one dielectric layer and the first substrate;
   providing a patterned sheet comprising a patterned layer structure on a second substrate, the patterned layer structure including electrically conductive regions spaced apart on the substrate;
   passing the laminate and patterned sheets through a pressure-applying means, wherein the layer structure faces the patterned layer structure and wherein the pressure-applying means includes a plate defining an image; and
   transferring selected areas of the layer structure corresponding to the image from the laminate sheet onto the patterned sheet using the pressure-applying means, leaving unselected areas of the layer structure on the first substrate.

21. A method according to claim 20, wherein the conductive layer comprises a semiconducting layer.

* * * * *